(12) United States Patent
Kim et al.

(10) Patent No.: US 10,985,109 B2
(45) Date of Patent: Apr. 20, 2021

(54) SHIELDED SEMICONDUCTOR PACKAGES WITH OPEN TERMINALS AND METHODS OF MAKING VIA TWO-STEP PROCESS

(71) Applicant: STATS ChipPAC Pte. Ltd., Singapore (SG)

(72) Inventors: ChangOh Kim, Incheon (KR); KyoWang Koo, Incheon (KR); SungWon Cho, Seoul (KR); BongWoo Choi, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 16/234,233

(22) Filed: Dec. 27, 2018

(65) Prior Publication Data
US 2020/0211977 A1    Jul. 2, 2020

(51) Int. Cl.
| | |
|---|---|
| *H01L 21/56* | (2006.01) |
| *H01L 21/48* | (2006.01) |
| *H01L 23/552* | (2006.01) |
| *H01L 23/31* | (2006.01) |
| *H01R 43/20* | (2006.01) |
| *H01R 43/26* | (2006.01) |
| *H01R 12/79* | (2011.01) |
| *H01R 12/52* | (2011.01) |

(52) U.S. Cl.
CPC ........ *H01L 23/552* (2013.01); *H01L 21/4814* (2013.01); *H01L 21/4853* (2013.01); *H01L 21/563* (2013.01); *H01L 23/3121* (2013.01); *H01R 12/52* (2013.01); *H01R 12/79* (2013.01); *H01R 43/205* (2013.01); *H01R 43/26* (2013.01); *H01L 21/565* (2013.01)

(58) Field of Classification Search
CPC .............. H01L 23/552; H01L 21/4814; H01L 21/4853; H01L 21/563; H01L 23/3121
USPC ......................................................... 257/659
See application file for complete search history.

(56) References Cited

U.S. PATENT DOCUMENTS

| | | | | |
|---|---|---|---|---|
| 6,744,126 B1 * | 6/2004 | Chiang | ............... | H01L 21/4821 257/686 |
| 7,752,751 B2 * | 7/2010 | Kapusta | ................ | C23C 14/046 29/846 |
| 7,968,979 B2 | 6/2011 | Pagaila et al. | | |
| 2008/0210462 A1 * | 9/2008 | Kawagishi | ............ | H01L 25/165 174/377 |
| 2009/0223711 A1 * | 9/2009 | Ueno | ................... | H05K 9/0086 174/377 |
| 2009/0302435 A1 * | 12/2009 | Pagaila | ................ | H01L 21/561 257/659 |

(Continued)

*Primary Examiner* — Sheikh Maruf
(74) *Attorney, Agent, or Firm* — Brian M. Kaufman; Robert D. Atkins; Patent Law Group: Atkins and Associates, P.C.

(57) ABSTRACT

A semiconductor device has a substrate including a terminal and an insulating layer formed over the terminal. An electrical component is disposed over the substrate. An encapsulant is deposited over the electrical component and substrate. A portion of the insulating layer over the terminal is exposed from the encapsulant. A shielding layer is formed over the encapsulant and terminal. A portion of the shielding layer is removed to expose the portion of the insulating layer. The portion of the insulating layer is removed to expose the terminal. The portion of the shielding layer and the portion of the insulating layer can be removed by laser ablation.

25 Claims, 11 Drawing Sheets

(56) References Cited

U.S. PATENT DOCUMENTS

| | | | |
|---|---|---|---|
| 2009/0321898 A1* | 12/2009 | Pagaila | H01L 23/552 257/660 |
| 2010/0246143 A1* | 9/2010 | Dinh | H05K 9/0028 361/748 |
| 2010/0320577 A1* | 12/2010 | Pagaila | H01L 23/552 257/659 |
| 2011/0063810 A1* | 3/2011 | Chen | H05K 9/006 361/752 |
| 2012/0147571 A1* | 6/2012 | Just | H05K 1/147 361/750 |
| 2012/0168916 A1* | 7/2012 | Chi | H01L 23/5389 257/659 |
| 2012/0228749 A1* | 9/2012 | Pagaila | H01L 23/147 257/659 |
| 2012/0248585 A1* | 10/2012 | Wu | H01L 23/3121 257/659 |
| 2012/0261181 A1* | 10/2012 | Izawa | H05K 9/0024 174/378 |
| 2012/0273926 A1* | 11/2012 | Pagaila | H01L 24/49 257/659 |
| 2012/0280374 A1* | 11/2012 | Choi | H01L 24/83 257/659 |
| 2012/0320558 A1* | 12/2012 | Foster | H05K 1/0218 361/818 |
| 2013/0037923 A1* | 2/2013 | Yoo | H01L 23/552 257/659 |
| 2013/0292804 A1* | 11/2013 | Lee | H01L 21/56 257/621 |
| 2014/0145353 A1* | 5/2014 | Cruzado | H01L 23/552 257/787 |
| 2014/0264786 A1* | 9/2014 | Pagaila | H01L 24/13 257/659 |
| 2015/0228590 A1* | 8/2015 | Oh | H01L 21/76877 257/659 |
| 2015/0287708 A1* | 10/2015 | Lin | H01L 25/50 438/109 |
| 2015/0303172 A1* | 10/2015 | Law | H01L 21/561 257/659 |
| 2015/0348936 A1* | 12/2015 | Lin | H01L 21/568 257/659 |
| 2016/0197059 A1* | 7/2016 | Lin | H10L 25/50 257/659 |
| 2017/0301986 A1* | 10/2017 | Nguyen | H01L 21/78 |

* cited by examiner

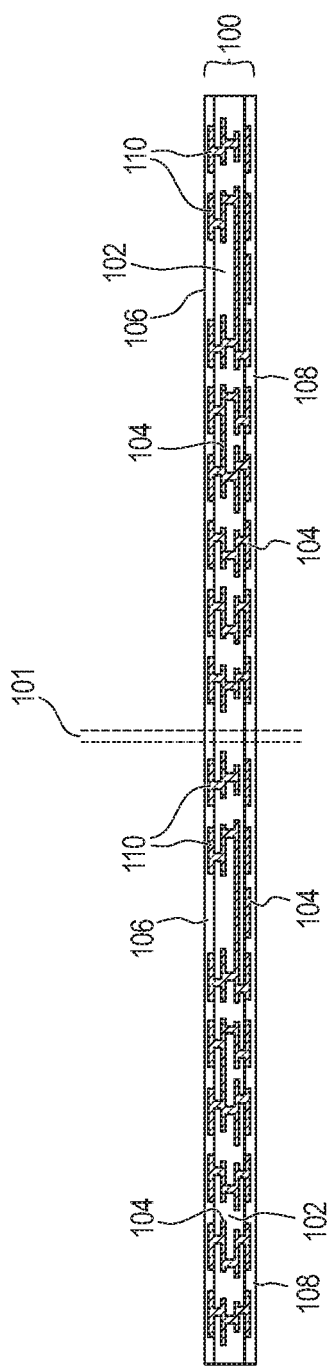
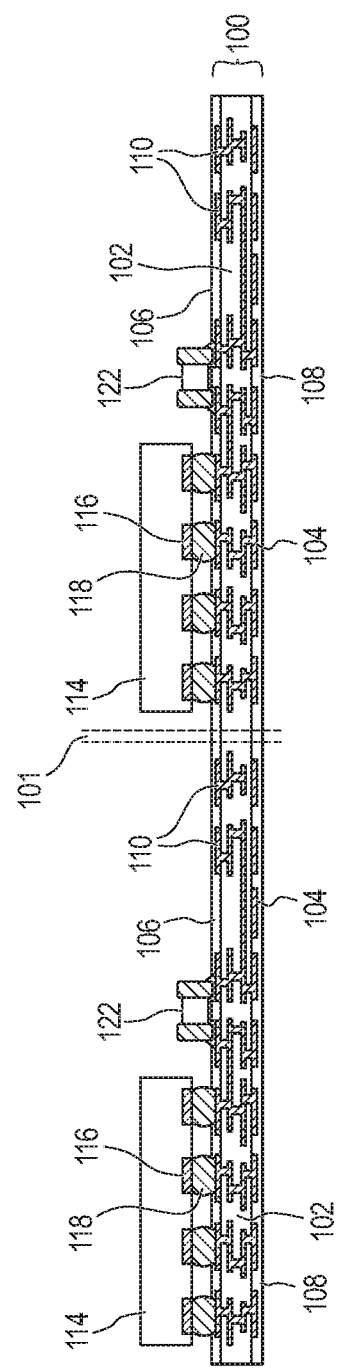
FIG. 1a
FIG. 1b

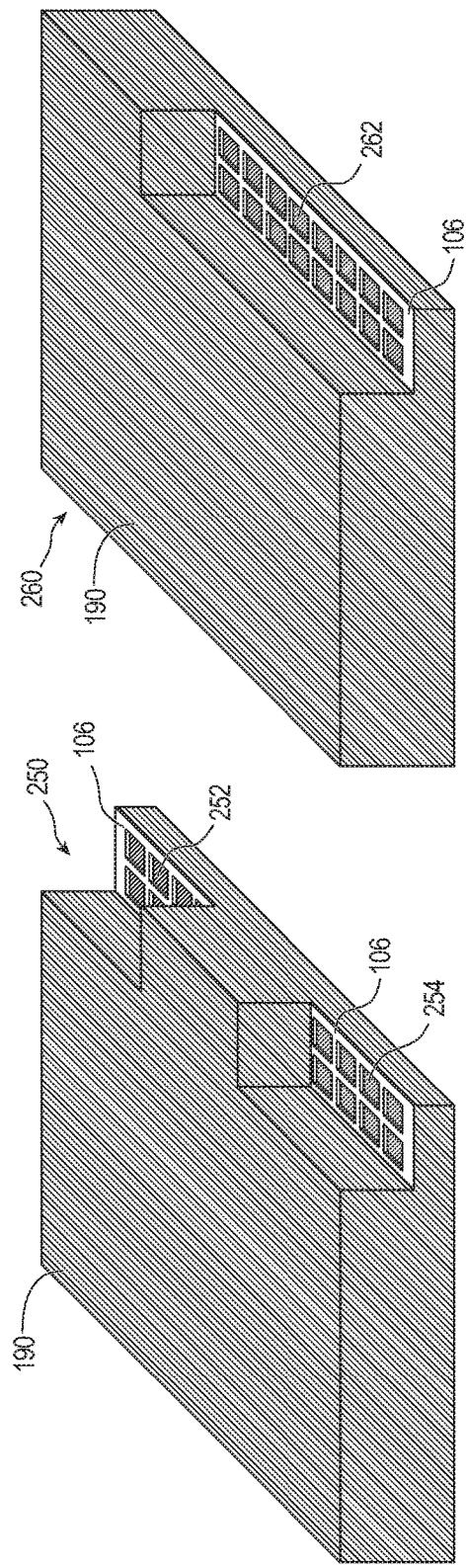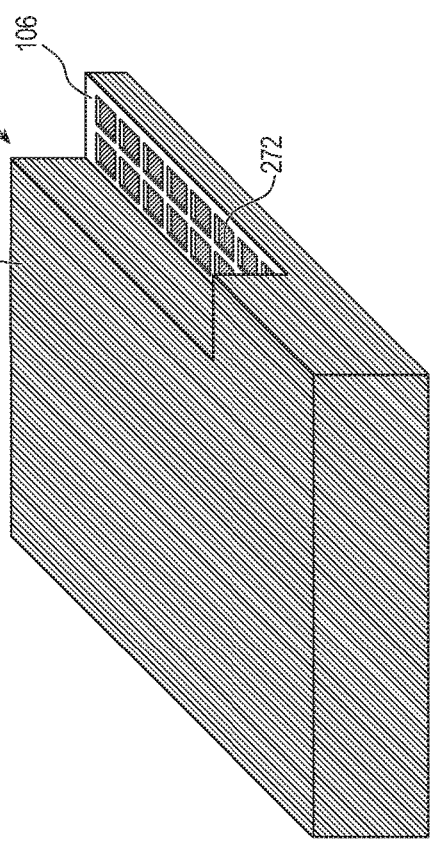

SHIELDED SEMICONDUCTOR PACKAGES WITH OPEN TERMINALS AND METHODS OF MAKING VIA TWO-STEP PROCESS

FIELD OF THE INVENTION

The present invention relates in general to semiconductor devices and, more particularly, to semiconductor packages with electromagnetic interference (EMI) shielding and one or more open terminals or sockets.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices from malfunction.

One problem with prior methods of semiconductor package shielding is that forming the shielding layer over a package completely covers the top of the package. Many semiconductor packages need open areas with exposed sockets or terminals that allow connection to adjacent semiconductor devices. Unfortunately, traditional shielding completely covers the packages and would short circuit any exposed terminals or sockets together. Therefore, a need exists for semiconductor devices with both EMI shielding and also exposed terminals or sockets, as well as methods of making such devices.

BRIEF DESCRIPTION OF THE DRAWINGS

FIGS. 1a-1k illustrate forming semiconductor packages with exposed terminals and electromagnetic interference (EMI) shielding;

FIGS. 2a-2g illustrate alternative configurations for the exposed terminals.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding compound is deposited over the package to provide physical support and electrical isolation. The finished package is then inserted into an electrical system and the functionality of the semiconductor device is made available to the other system components.

Figure 1C:
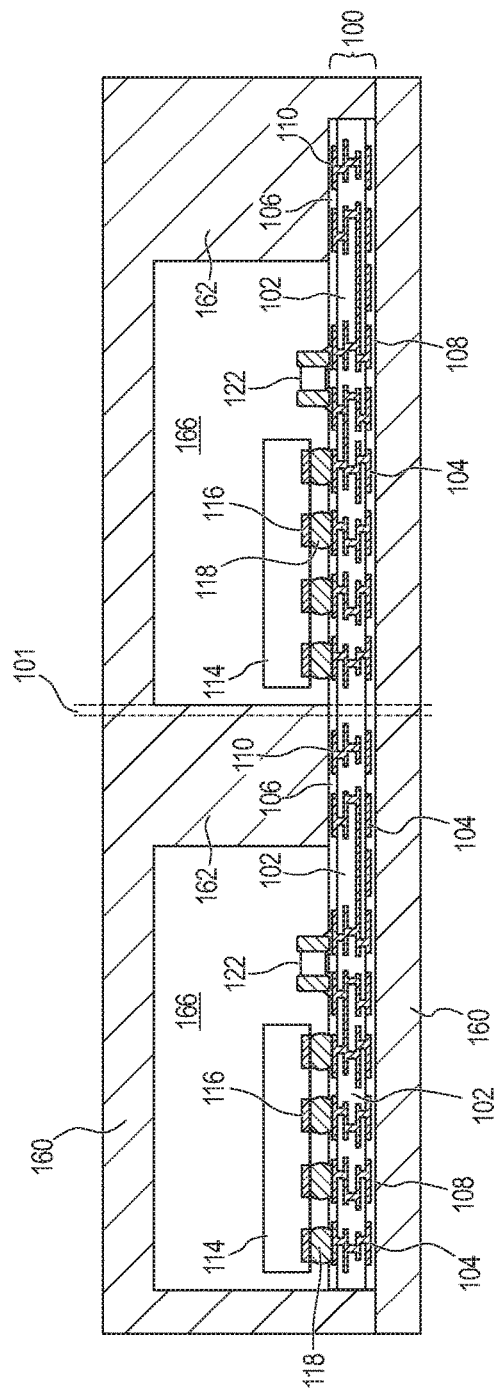

FIGS. 1a-1k illustrate a method of forming a semiconductor package with shielding and an exposed terminal using a two-step partial shielding removal process. FIG. 1a shows a partial cross-sectional view of substrate 100, which serves as a base for the package formation process. The illustrated portion of substrate 100 includes room for forming two packages separated by a saw street 101. However, the entirety of substrate 100 will commonly include room for forming hundreds, thousands, or even more packages in parallel.

Substrate 100 is formed from a base insulating material 102 with conductive layers 104 formed over outer surfaces of the substrate and interleaved between layers of the insulating material. Conductive layers 104 include contact pads, conductive traces, and conductive vias configured as necessary to implement a desired signal routing. Portions of conductive layers 104 are electrically common or electrically isolated depending on the design and function of the device being formed. Conductive layers 104 are formed using PVD, CVD, electrolytic plating, electroless plating, or other suitable metal deposition process. Conductive layers 104 can be one or more layers of aluminum (Al), copper (Cu), tin (Sn), nickel (Ni), gold (Au), silver (Ag), or other suitable electrically conductive material.

Conductive layers 104 include terminals 110 for external interconnection of the final package. Terminals 110 are formed on the top surface of substrate 100, and will remain exposed in the final package for electrical connection to another external device or package.

Substrate 100 can also be any suitable laminate interposer, PCB, wafer-form, strip interposer, leadframe, or other type of substrate. Substrate 100 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Insulating material 102 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide (PI), benzocyclobutene (BCB), polybenzoxazoles (PBO), and other material having similar insulating and structural properties. Substrate 100 can also be a multi-layer flexible laminate, ceramic, copper clad laminate, glass, or semiconductor wafer including an active surface containing one or more transistors, diodes, and other circuit elements to implement analog or digital circuits.

Solder resist or passivation layers 106 and 108 are formed over the top and bottom surfaces of substrate 100 for physical protection of exposed contact pads. Passivation layers 106 are formed from any suitable material for a passivation or solder resist layer, including those mentioned above with regard to insulating material 102, e.g., polyimide.

In FIG. 1b, semiconductor die 114 are flip-chip mounted to the top surface of substrate 100. Semiconductor die 114 includes contact pads 116 for electrical interconnection and is mounted to substrate 100 using solder bumps 118 reflowed between contact pads 116 and contact pads of conductive layers 104. Other interconnect structure types, such as stud bumps, conductive pillars, or bond wires are used in other embodiments. Openings are formed in passivation layer 106 to expose contact pads for connecting semiconductor die 114.

Semiconductor die 114 is packaged along with a discrete passive component 122 and any other desired electrical components by disposing the components on substrate 100. Components 122 are mounted to contact pads of conductive layer 104 through openings of passivation layer 106, similar to semiconductor die 114. Any electrical component or combination of electrical components can be disposed on substrate 100 for any desired purpose.

A solder material disposed between component 122 is reflowed to connect those components. In some embodiments, the solder material for discrete passive component 122 is a solder paste printed onto substrate 100 prior to surface mounting the components to the substrate. The components disposed on substrate 100 may comprise a system-in-package (SiP) module. The components mounted onto substrate 100 can include semiconductor die, semiconductor packages, discrete active or passive components, or any other suitable electrical component.

FIG. 1c shows substrate 100 with semiconductor die 114 and components 122 disposed in a mold 160. Mold 160 shapes a deposited encapsulant into the desired shape for the semiconductor package. Mold 160 includes extensions 162 extending to and contacting passivation layer 106 over terminals 110, to substantially block the molding compound from extending over the terminals. Other methods of keeping terminals 110 free of molding compound are used in other embodiments. The molding compound is deposited with a mask over terminals 110 in one embodiment. In another embodiment, molding compound is deposited over the entirety of substrate 100, including terminals 110, and then removed over the terminals using laser drilling, mechanical drilling, chemical etching, or another suitable process.

In embodiments where opening 168 extends across an entire length or width of each package, a saw blade can be used to create a trench across an entire width or length of substrate 100 after depositing encapsulant 166. Passivation layer 106 remains covering terminals 110, which protects the terminals during the molding process and any subsequent encapsulant removal process that may be used. Passivation layer 106 operates as an etch stop layer in some embodiments where encapsulant 166 is deposited and then removed over terminals 110.

Figure 1D:
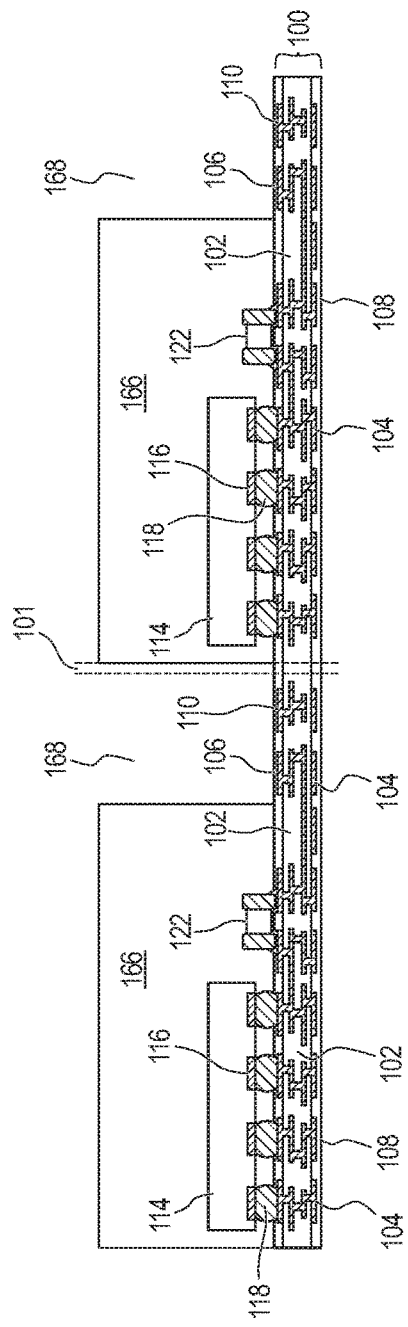

FIG. 1d shows encapsulant 166 after being deposited on substrate 100 over semiconductor die 114 and component 122 using a paste printing, compressive molding, transfer molding, liquid encapsulant molding, vacuum lamination, spin coating, or another suitable applicator. Encapsulant 166 can be polymer composite material, such as epoxy resin, epoxy acrylate, or polymer with or without a filler. Encapsulant 166 is non-conductive, provides structural support, and environmentally protects the semiconductor device from external elements and contaminants. Encapsulant 166 includes an opening 168 formed over terminals 110 where extensions 162 of mold 160 blocked the encapsulant.

Figure 1E:
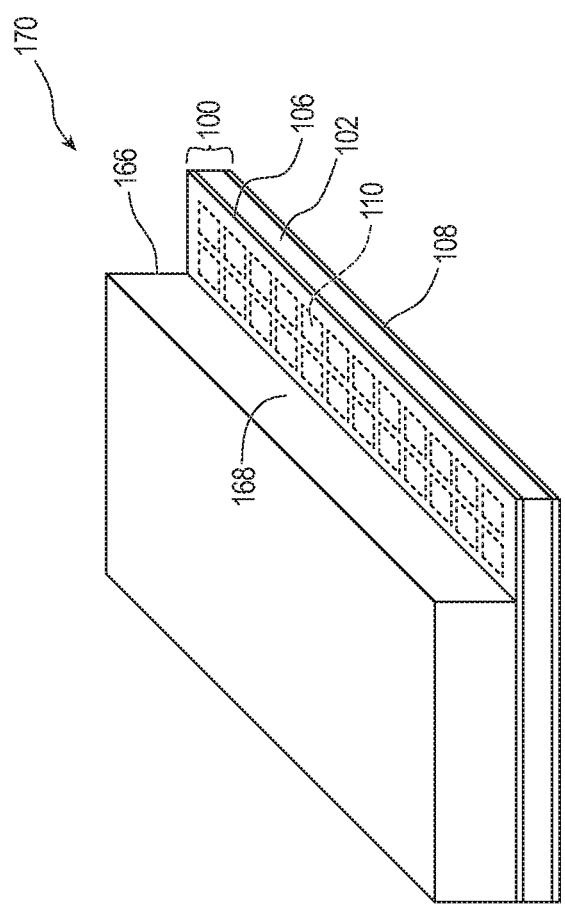

Substrate 100 with encapsulant 166 is removed from mold 160, if used, and singulated through saw streets 101 using a laser cutting tool, saw blade, water cutting tool, or another suitable means to form individual packages 170. FIG. 1e illustrates a perspective view of package 170 after singulation showing the position of terminals 110 and opening 168 relative to the package as a whole. Opening 168 only extends over terminals 110 and a small periphery of the terminals. In other embodiments, terminal 110 can be located in other spots on substrate 100, as illustrated in FIGS. 2a-2g, with opening 168 moved accordingly.

Figure 1F:
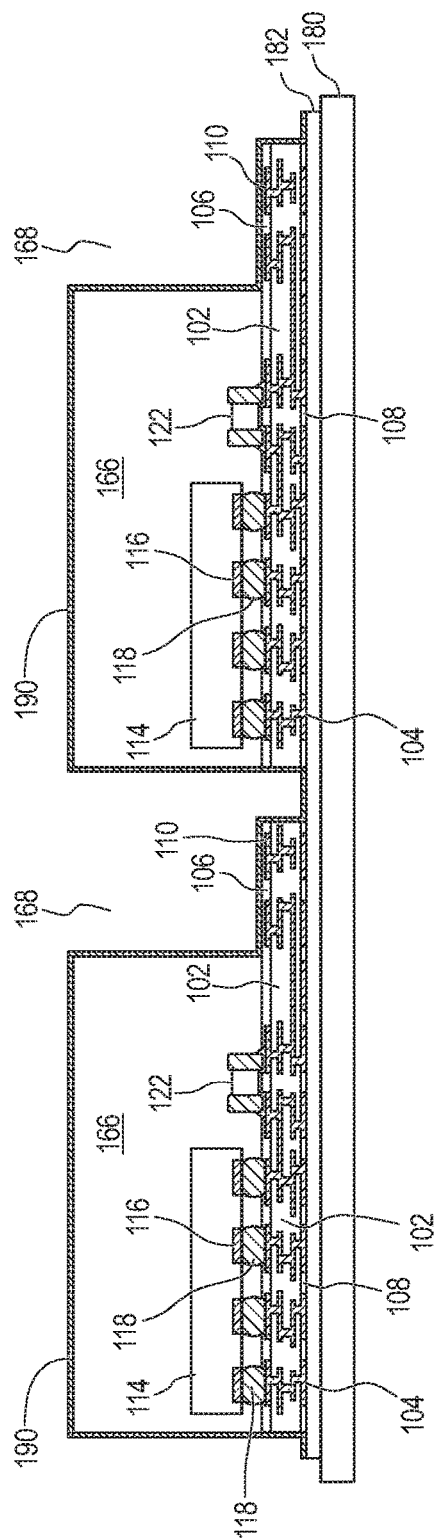
Figure 1G:
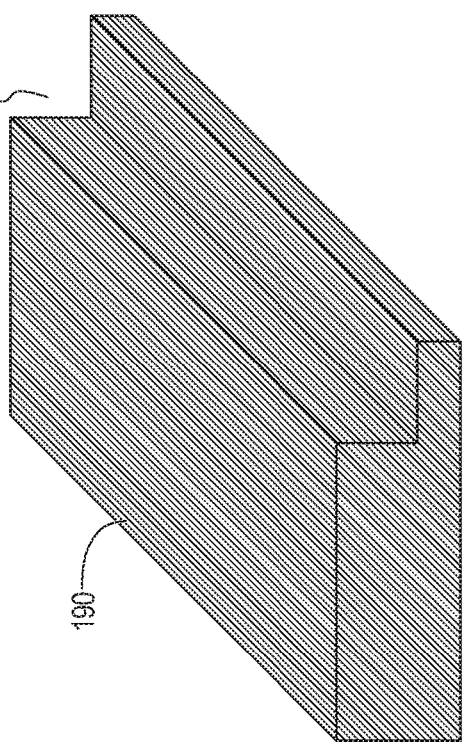

In FIGS. 1f and 1g, semiconductor packages 170 are disposed on carrier 180 with an optional thermal release, ultraviolet (UV) release, adhesive, or other suitable interface layer 182. Carrier 180 is a panel of glass, aluminum, steel, copper, polymer, silicon, or another suitable material, with a sufficient rigidity to support a number of packages 170 to be processed together. Only two packages 170 are illustrated, but hundreds, thousands, or more packages are typically processed at once. In some embodiments, carrier 180 is the same carrier that was used in the processing steps of FIGS. 1a-1d. Packages 170 can be left in place after singulation rather than being disposed on a different carrier for application of EMI shielding.

A conductive material is sputtered over packages 170 to form conformal shielding layer 190. Shielding layer 190 is formed by any suitable metal deposition technique, e.g., chemical vapor deposition, physical vapor deposition, other sputtering methods, spraying, or plating. Shielding layer 190 completely covers the exposed tops and sides of encapsulant 166 and substrate 100, including terminals 110. Terminals 110 remain covered by passivation layer 106 and do not directly physically contact shielding layer 190. Passivation layer 106 remains disposed between terminals 110 and shielding layer 190. In some embodiments, a portion of conductive layer 104 in substrate 100 is exposed at a side of the substrate to physically contact shielding layer 190 and is used to electrically connect the shielding layer to a ground voltage node. Shielding layer 190 covers every exposed surface of package 170. Generally, only the bottom surface of package 170 remains uncovered by shielding layer 190 due to the bottom surface being in contact with carrier 180 or interface layer 182.

Figure 1H:
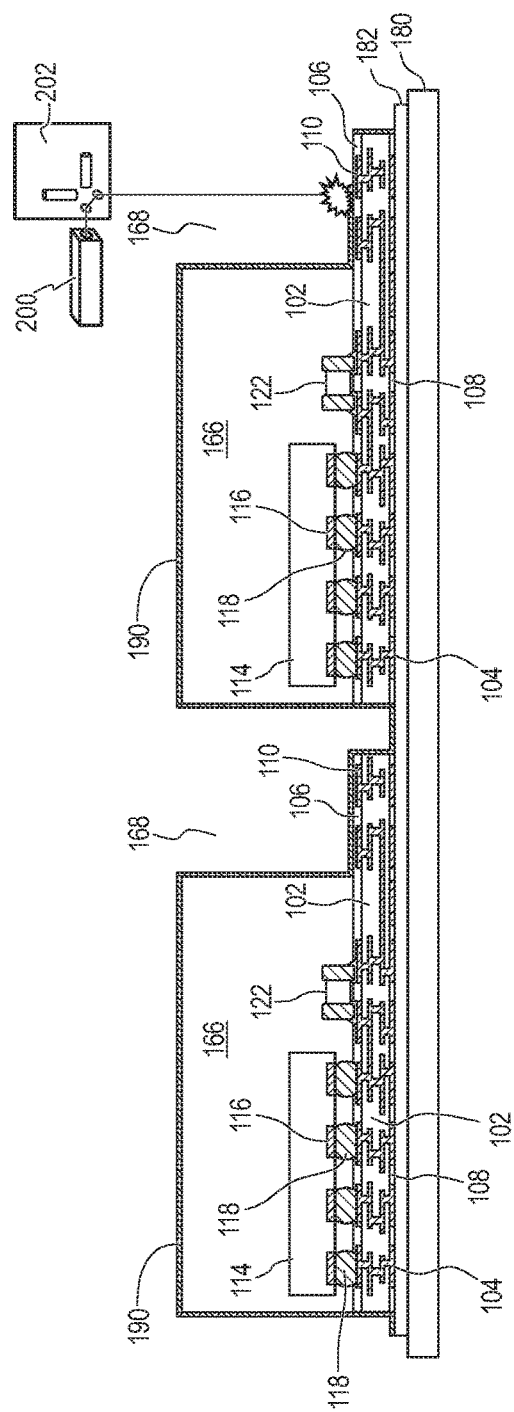

In FIG. 1h, laser ablation is performed with laser 200 to remove a portion of shielding layer 190 over terminals 110. Laser 200 is a diode-pumped solid-state (DPSS) laser, an exciplex laser with ArF, KrF, XeCl, XeF, or another suitable excimer, ultraviolet, visible, infrared, a yttrium aluminum garnet (YAG) laser doped with neodymium, erbium, ytterbium, or another suitable material, or a $CO_2$ laser with µs, ns, ps, or fs pulses. Various lenses can be used as desired, e.g., focus, collimator, apochromat, achromat. Mirrors, scanners, slits, filters, or other suitable devices can be used to guide or condition the light signal from laser 200. In FIG. 1h, a scanner 202 is used to guide laser 200 over the surface area of terminals 110.

Energy emitted by laser 200 strips shielding layer 190 from over terminals 110 but leaves passivation layer 106 covering the terminals. In some embodiments, shielding layer 190 is removed using a metal peeling process, whereby the beam from laser 200 is defocused and the energy peels off the desired portion of the shielding layer. Metal peeling is a type of laser ablation. After the peeling process removes shielding layer 190 over terminals 110, soft laser ablation is performed with laser 200 set at a low power level as a cleaning process to remove remaining metal residue. Any suitable peeling, hatching, lift-off, or ablation technique can be used to partially remove shielding layer 190. In other embodiments, other methods besides laser ablation are used to remove shielding layer 190 over terminals 110, e.g., chemical etching or mechanical grinding.

Figure 1I:
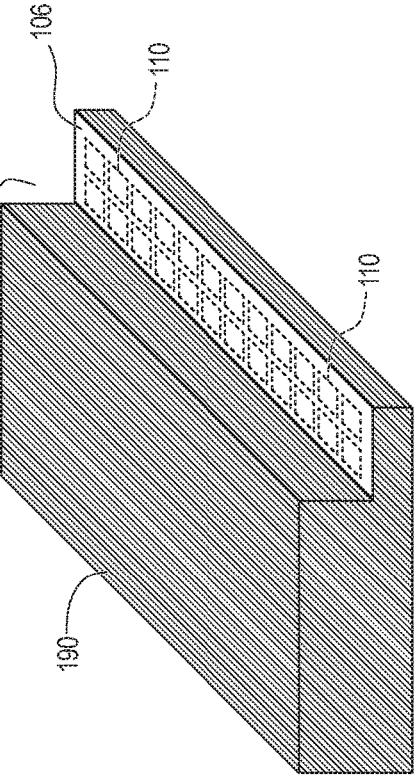

FIG. 1i shows a perspective view with shielding layer 190 removed over terminals 110. Terminals 110 remain covered by passivation layer 106. Shielding layer 190 remains totally covering side surfaces of substrate 100 and encapsulant 166 and the top surface of the encapsulant.

Figure 1J:
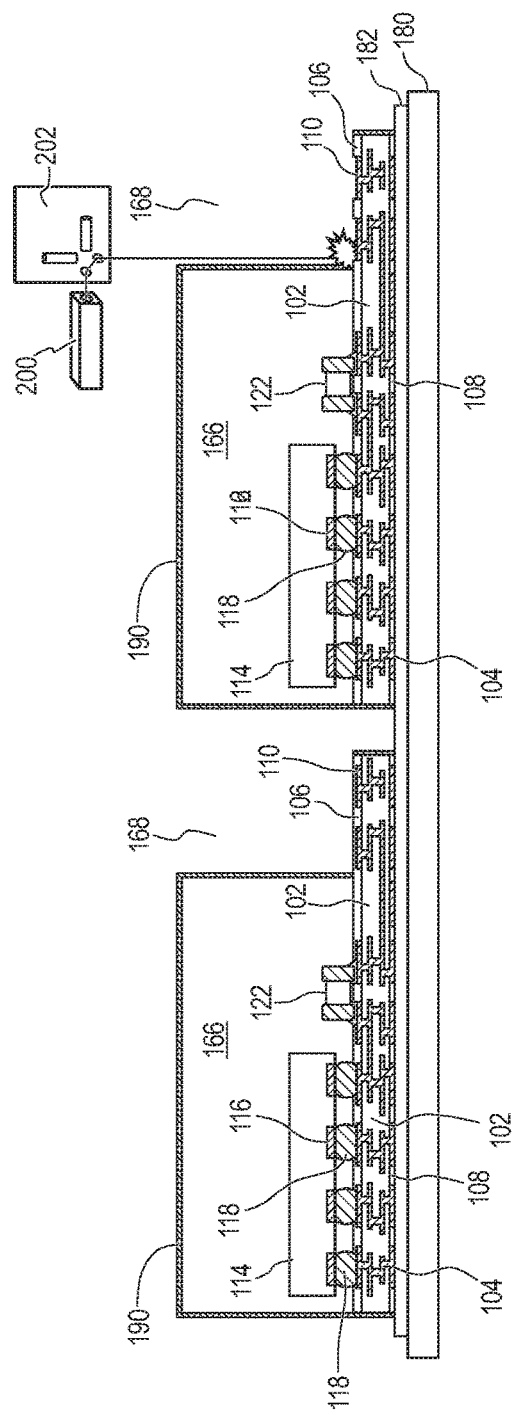

In FIG. 1j, laser 200 is used to form openings in passivation layer 106 and expose terminals 110 for subsequent interconnect. Laser 200 is the same laser used to partially remove shielding layer 190 in FIG. 1h, but reconfigured with a different frequency or power output if necessary. In other embodiments, a different laser is used. Scanner 202 moves the laser beam from laser 200 across terminals 110 to expose the terminals for subsequent electrical interconnect.

Figure 1K:
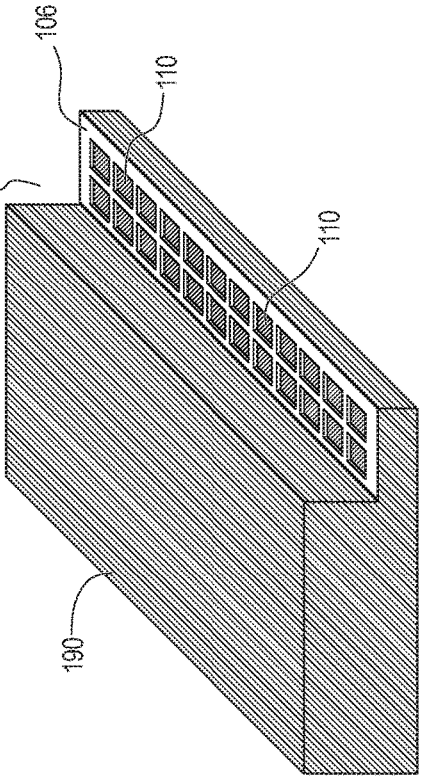

FIG. 1k illustrates a perspective view with terminals 110 exposed through openings in passivation layer 106. Shielding layer 190 completely covers the top and all side surfaces of encapsulant 166, including within opening 168, and the side surfaces of substrate 100 while exposing terminals 110 for electrical interconnect.

Passivation layer 106 remains over substrate 100 and may operate as a solder resist layer. Openings in passivation layer 106 can be smaller than respective terminals 110, larger than the respective terminals, or the same size. Packages 170 are removed from carrier 180, which separates the portions of shielding layer 190 between packages. Packages 170 can be installed onto the substrate of a larger electronic device using a pick and place operation, packaged into a tape and reel for delivery, or otherwise disposed.

Semiconductor package 170 is fully shielded by shielding layer 190 except for an open socket or terminal area with exposed terminals 110. Shielding layer 190 sufficiently blocks electromagnetic noise generated by components within package 170 from radiating and causing malfunction in nearby devices, and vice versa.

Figure 2A:
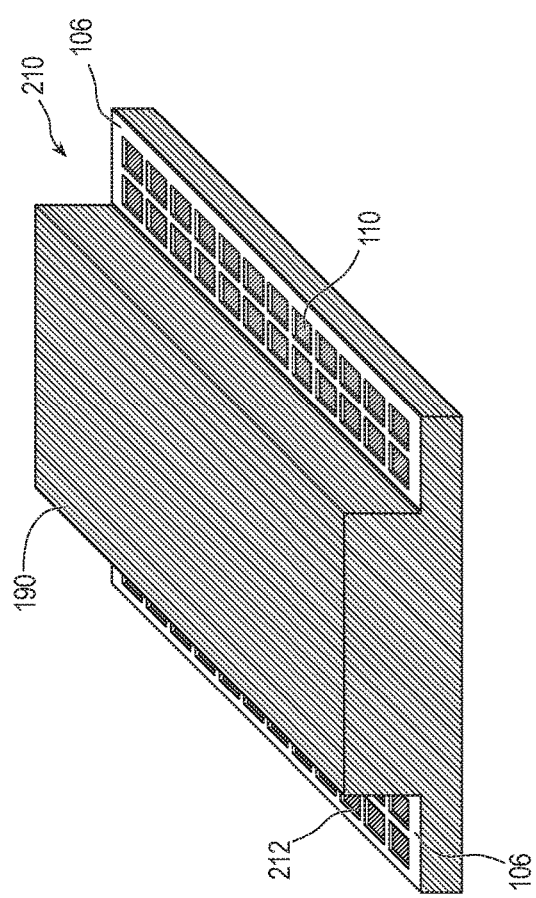
Figure 2B:
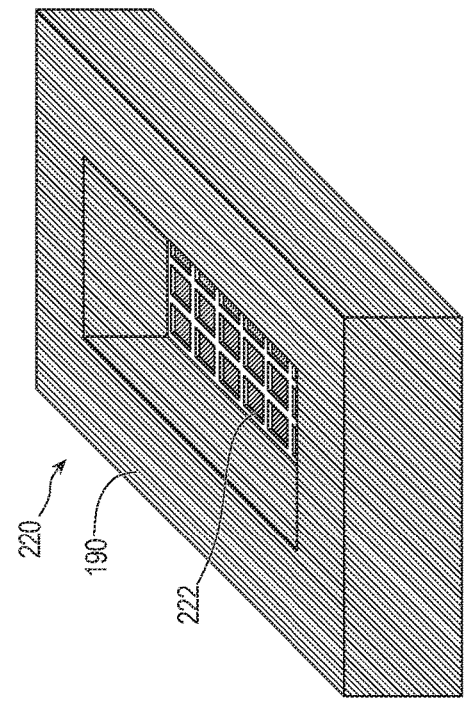

FIGS. 2a-2g illustrate alternative non-limiting locations for the terminal or socket on the package. FIG. 2a shows package 210 with terminals 110 as above, and additional terminals 212 on the opposite side of the package. Terminals 212 run in parallel to terminals 110 on the opposite side of package 210. FIG. 2b shows package 220 with terminals 222. Terminals 222 are formed in the middle of package 220, surrounded by a ring of encapsulant 166, rather than at an edge of the package as with terminals 110.

Figure 2C:
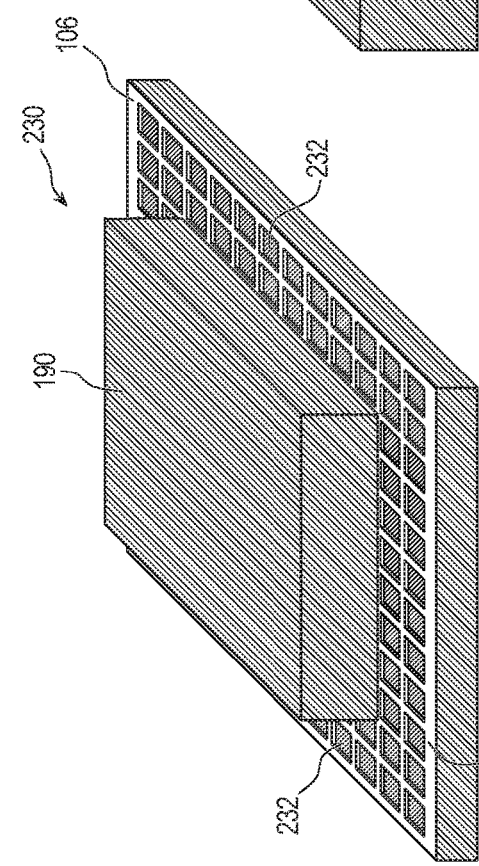
Figure 2D:
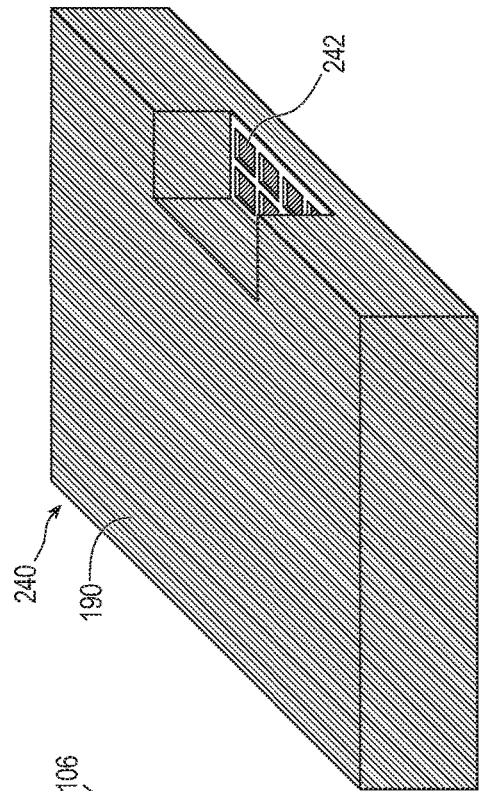

FIG. 2c shows package 230 with terminals 232 formed continuously around the package to surround the remaining portion of encapsulant 166. In FIG. 2d, package 240 has terminals 242 formed along only a middle portion of one of the package edges, while in FIG. 2e package 250 has terminals 252 and 254 formed at the two ends of the edge without extending to the middle. FIG. 2f shows package 260 with terminals 262 formed at the left end of the package edge, and FIG. 2g has package 270 with terminals 272 formed at the right end of the edge.

Terminals can be formed at any location within a package, and then exposed via the two-step laser process disclosed above. Any of the above terminal locations can be used in combination. The semiconductor die and other components for the package are disposed in the remaining area of encapsulant 166.

Figure 3A:
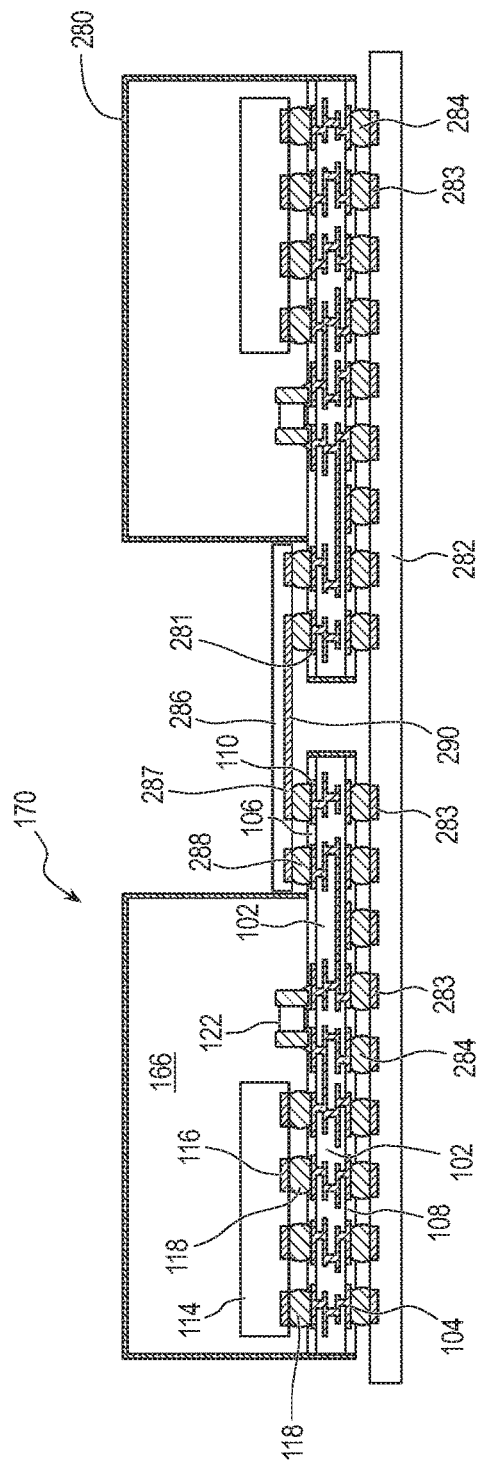
FIGS. 3a-3e illustrate integrating the packages into an electronic device and various embodiments for connecting to the packages through the exposed terminals.

FIGS. 3a-3e illustrate incorporating the above described shielded packages, e.g., package 170 with shielding layer 190 from FIG. 1k, into an electronic device. FIG. 3a illustrates a partial cross-section of package 170 mounted onto a PCB or other substrate 282 as part of an electronic device. Bumps 284 are formed on conductive layer 104 on the opposite side of substrate 100 from semiconductor die 114. Conductive bumps 284 can be formed at any stage of the manufacturing process, e.g., prior to molding in FIG. 1c, prior to singulation in FIG. 1e, or after forming shielding layer 190. Bumps 284 are reflowed onto conductive layer 283 of PCB 282 to physically attach and electrically connect package 170 to the PCB. In other embodiments, thermocompression or other suitable attachment and connection methods are used. In some embodiments, an adhesive or underfill layer is used between package 170 and PCB 282. Semiconductor die 114 is electrically coupled to conductive layer 283 through bumps 118, conductive layers 104, and bumps 284.

A second semiconductor package 280 is disposed on substrate 282 adjacent to package 170. Package 280 is illustrated as a package that mirrors package 170. However, any suitable package configuration with any desired electrical components or combination of electrical components can be disposed on substrate 282 and connected to package 270 through terminals 110. Package 280 has exposed terminals 281 disposed adjacent to terminals 110 of package 170. A board-to-board (B2B) connector 286 is mounted onto terminals 110 and 281 to electrically connect package 170 and package 280.

B2B connector 286 is a PCB or other suitable substrate or interposer with conductive layers 287 to route electrical signals between packages. B2B connector 286 is mechanically and electrically connected to terminals 110 and 281 by solder bumps 288 reflowed between the B2B connector and the terminals. B2B connector 286 provides a direct electrical connection between two packages without requiring signal routing through PCB 282, which can ease signal routing requirements of the electrical device and provide faster and more direct signal transmission.

Figure 3B:
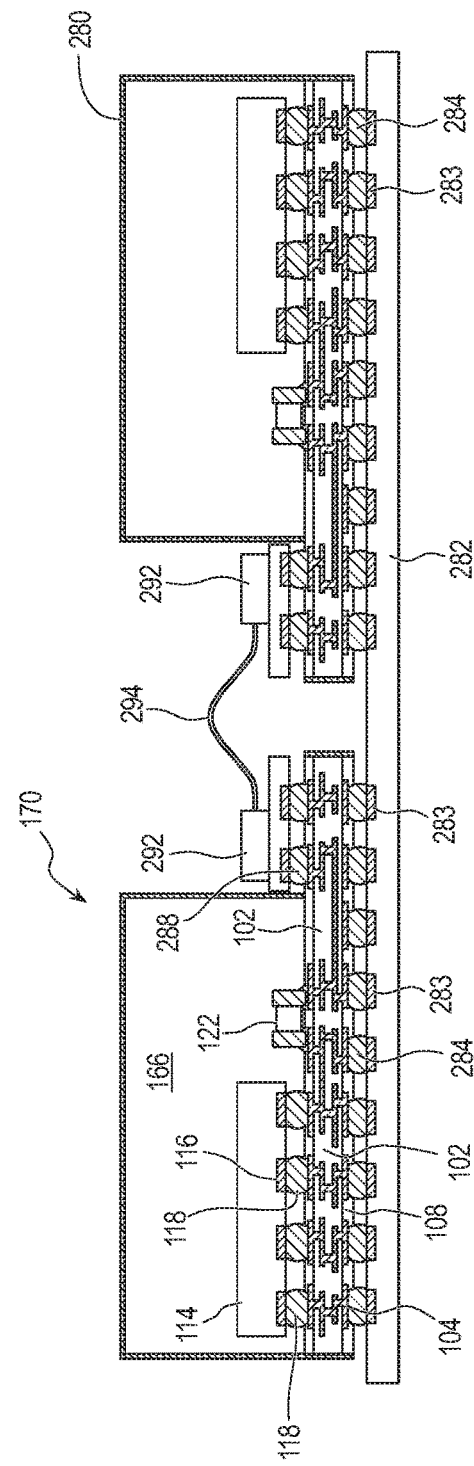

FIG. 3b illustrates packages 170 and 280 each having a ribbon cable connector 292 mounted onto terminals 110 and 281, respectively. A ribbon cable or flexible PCB 294 is connected to one of the connectors 292 at each end. Any suitable interconnect structure or connection mechanism can be used to connect package 170 to another location within an electronic device via terminals 110.

Figure 3C:
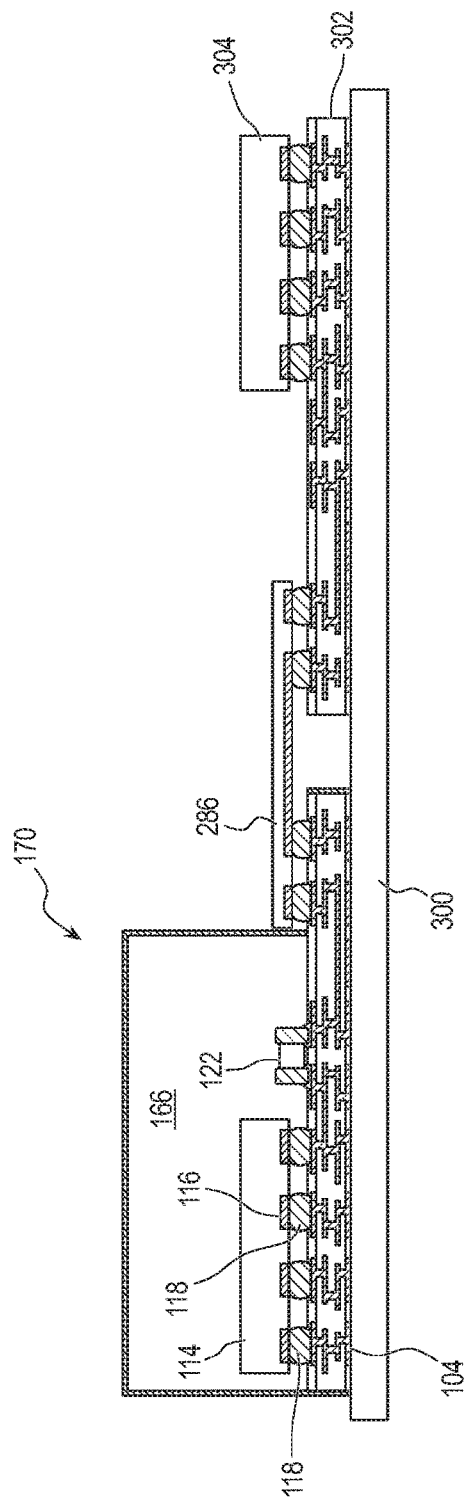

Terminals 110 can also allow more flexible usage of package 170 because the terminals on top of substrate 100 can be used to integrate the package into an electronic device rather than using contact pads on the bottom of substrate 100. In FIG. 3c, package 170 is disposed on a substrate 300 without being electrically connected to the substrate. Substrate 300 can be a structural part of the electronic device, such as the shell of a mobile phone, that package 280 is mounted to. A PCB or flexible PCB 302 holds other circuit components that implement other functionality of the electronic device, and is mounted onto substrate 300 adjacent to package 170. PCB 302 and package 170 can be directly mounted to substrate 300 with an adhesive, screwed down with risers that keep package 170 and PCB 302 separated from substrate 300, or attached by any other suitable mechanism. B2B connector 286, or another interconnect structure, is used to connect package 170 to PCB 302 to integrate the functionality of semiconductor die 114 with the functionality of, e.g., semiconductor die 304.

Figure 3D:
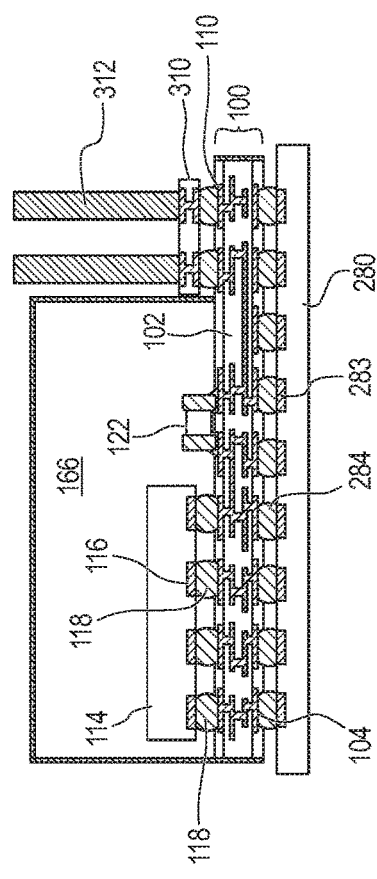

In FIG. 3d, a PCB 310 with header pins 312 formed thereon is mounted onto terminals 110. Header pins 312 can be used for a variety of purposes, such as testing package 170, allowing configuration via jumpers, or connecting package 170 to another header via a ribbon cable.

Figure 3E:
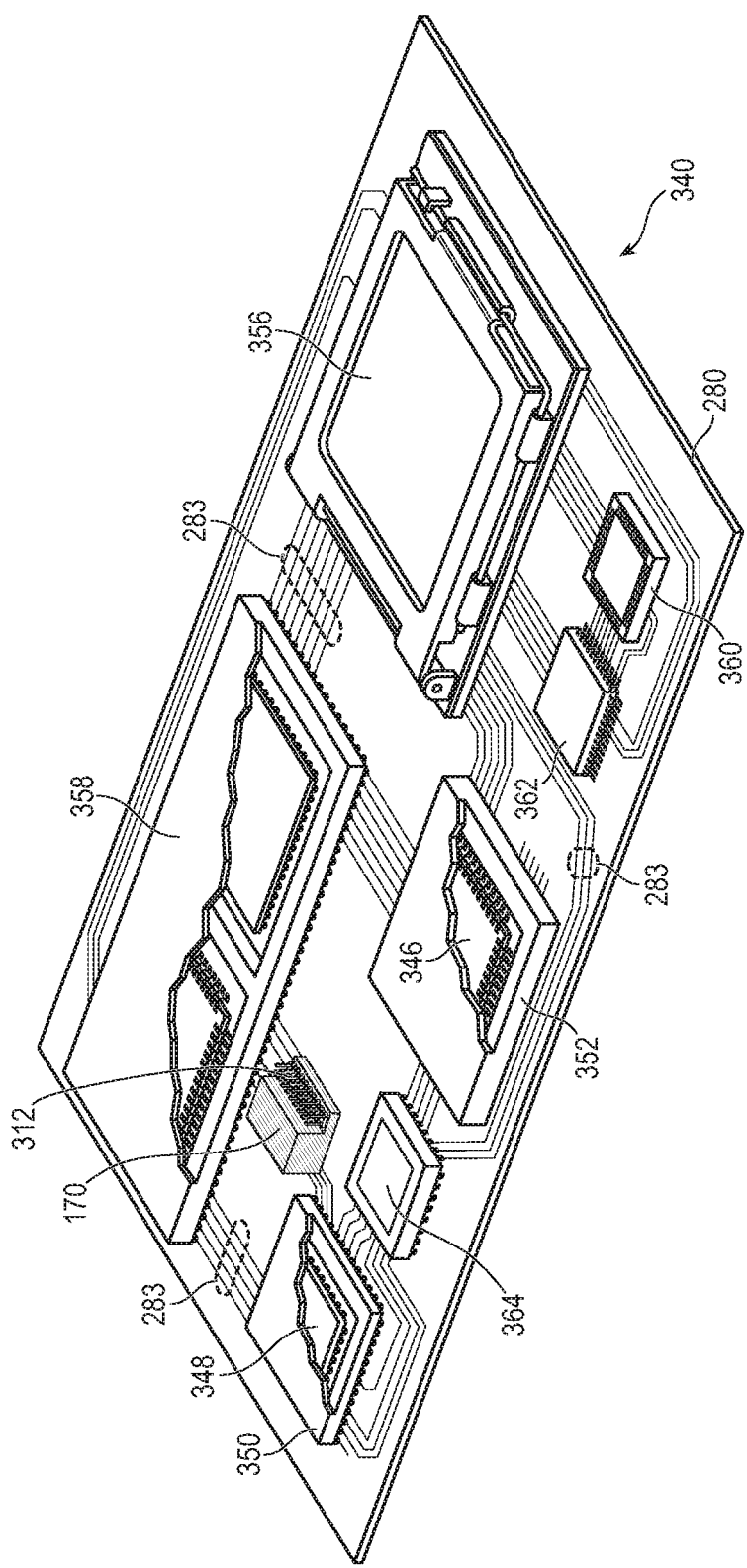

FIG. 3e illustrates electronic device 340 including PCB 282 with a plurality of semiconductor packages mounted on a surface of the PCB, including package 170 with header pins 312. Electronic device 340 can have one type of semiconductor package, or multiple types of semiconductor packages, depending on the application.

Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 3e, PCB 282 provides a general substrate for structural support and electrical interconnection of the semiconductor packages mounted on the PCB. Conductive signal traces 283 are formed over a surface or within layers of PCB 282 using evaporation, electrolytic plating, electroless plating, screen printing, or other suitable metal deposition process. Signal traces 283 provide for electrical communication between the semiconductor packages, mounted components, and other external systems or components. Traces 283 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 282. In other embodiments, a semiconductor device may only have the first level packaging where the die is mechanically and electrically mounted directly to PCB 282.

For the purpose of illustration, several types of first level packaging, including bond wire package 346 and flipchip 348, are shown on PCB 282. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 282 along with package 170. Conductive traces 283 electrically couple the various packages and components disposed on PCB 282 to package 170, giving use of the components within package 170 to other components on the PCB. Moreover, header pins 312 remain exposed for connection by testing equipment, etc. In other embodiments, some of the other packages of electronic device 340 are connected to package 170 via terminals 110, either via header 312 or another interconnect structure.

Depending upon the system requirements, any combination of semiconductor packages, configured with any combination of first and second level packaging styles, as well as other electronic components, can be connected to PCB 282. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a terminal and an insulating layer formed over the terminal;
   disposing an electrical component over the substrate;
   depositing an encapsulant over the electrical component and substrate after disposing the electrical component over the substrate, wherein a portion of the insulating layer over the terminal is exposed from the encapsulant;
   forming an electromagnetic interference (EMI) shielding layer over the encapsulant and terminal, wherein the EMI shielding layer physically contacts the insulating layer with the portion of the insulating layer disposed between the EMI shielding layer and terminal;
   removing a portion of the EMI shielding layer to expose the portion of the insulating layer; and
   removing the portion of the insulating layer to expose the terminal.

2. The method of claim 1, further including removing the portion of the EMI shielding layer using laser ablation.

3. The method of claim 1, further including removing the portion of the insulating layer using laser ablation.

4. The method of claim 1, further including disposing an interconnect structure over the terminal after removing the portion of the insulating layer.

5. The method of claim 4, wherein the interconnect structure includes a board-to-board connector.

6. The method of claim 4, wherein the interconnect structure includes a header pin.

7. A method of making a semiconductor device, comprising:
 providing a substrate including a terminal and an insulating layer formed over the terminal;
 forming an encapsulant over a first portion of the insulating layer while a second portion of the insulating layer over the terminal remains exposed from the encapsulant;
 forming a shielding layer over the substrate, insulating layer, and encapsulant with the shielding layer physically contacting the second portion of the insulating layer;
 removing a portion of the shielding layer to expose the second portion of the insulating layer; and
 removing the second portion of the insulating layer to expose the terminal.

8. The method of claim 7, further including removing the portion of the shielding layer using laser ablation.

9. The method of claim 8, further including removing the portion of the insulating layer using laser ablation.

10. The method of claim 7, further including:
 disposing a semiconductor package adjacent to the substrate; and
 connecting the semiconductor package to the terminal.

11. The method of claim 10, further including connecting the semiconductor package to the terminal through a ribbon cable or flexible printed circuit board.

12. The method of claim 10, further including connecting the semiconductor package to the terminal through a board-to-board connector.

13. The method of claim 7, wherein the terminal includes a contact pad.

14. A method of making a semiconductor device, comprising:
 providing a semiconductor package including an encapsulant, a terminal disposed outside a footprint of the encapsulant, an insulating layer formed over the terminal, and an electromagnetic interference (EMI) shielding layer formed over the encapsulant, insulating layer, and terminal;
 removing a portion of the EMI shielding layer to expose a portion of the insulating layer; and
 removing the portion of the insulating layer to expose the terminal.

15. The method of claim 14, further including removing the portion of the shielding layer using laser ablation.

16. The method of claim 14, further including removing the portion of the insulating layer using laser ablation.

17. The method of claim 14, further including:
 removing the portion of the shielding layer in a first manufacturing step; and
 removing the portion of the insulating layer in a second manufacturing step separate from the first manufacturing step.

18. The method of claim 14, further including disposing an interconnect structure over the terminal after removing the portion of the insulating layer.

19. The method of claim 18, further including connecting the semiconductor package to a second semiconductor package through the interconnect structure.

20. The method of claim 14, further including disposing a header over the terminal.

21. A method of making a semiconductor device, comprising:
 providing a substrate including a contact pad, an insulating layer formed over the contact pad, an encapsulant formed over a first portion of the insulating layer, and a conductive layer formed over the insulating layer and encapsulant, wherein a portion of the conductive layer physically contacts a second portion of the insulating layer;
 removing the portion of the conductive layer to expose the second portion of the insulating layer; and
 removing the second portion of the insulating layer to expose the contact pad.

22. The method of claim 21, further including disposing an interconnect structure over the contact pad.

23. The method of claim 22, wherein the interconnect structure extends outside a footprint of the substrate.

24. The method of claim 21, further including disposing a header pin over the contact pad.

25. The method of claim 21, wherein the substrate includes an electrical component disposed between the substrate and conductive layer.

* * * * *